United States Patent
Brown

(10) Patent No.: US 9,160,215 B2
(45) Date of Patent: Oct. 13, 2015

(54) MONITORING THE OPERATING CONDITIONS OF ELECTRIC GENERATORS AND MOTORS BY PARTIAL MEASUREMENTS

(71) Applicant: Christopher David Brown, Redmond, WA (US)

(72) Inventor: Christopher David Brown, Redmond, WA (US)

(*) Notice: Subject to any disclaimer, the term of this patent is extended or adjusted under 35 U.S.C. 154(b) by 59 days.

(21) Appl. No.: 14/184,553

(22) Filed: Feb. 19, 2014

(65) Prior Publication Data

US 2015/0236569 A1 Aug. 20, 2015

(51) Int. Cl.
*G01R 31/02* (2006.01)
*H02K 11/00* (2006.01)
*H02H 3/04* (2006.01)
*H02P 1/00* (2006.01)
*G01R 31/42* (2006.01)
*G01R 31/34* (2006.01)

(52) U.S. Cl.
CPC .............. *H02K 11/001* (2013.01); *G01R 31/34* (2013.01); *G01R 31/343* (2013.01); *G01R 31/42* (2013.01)

(58) Field of Classification Search
CPC ...... G01R 31/343; G01R 31/42; G01R 31/34; H02K 11/001; G07C 3/00
USPC .......................................................... 318/490
See application file for complete search history.

*Primary Examiner* — Kawing Chan
*Assistant Examiner* — Bradley Brown
(74) *Attorney, Agent, or Firm* — Arjomand Law Group, PLLC

(57) ABSTRACT

A method, a system, and an apparatus are disclosed for monitoring the operating conditions of electric generators and motors by merely taking measurements from a few locations on the rotor's outer region/surface or stator's inner surface. In this disclosure an exemplary method of detecting adverse conditions within alternating current electromotive devices, which can lead to failure, is presented. This example method uses non-contact sensing devices mounted only on a section of the rotor's or stator's surface of the electromotive device to scan the stator's or rotor's surface, respectively. The disclosed method and apparatus will reduce cost by reducing complexity of the design, manufacturing, installation, maintenance, and replacement of the monitoring system, and by utilizing generic mounting techniques that will reduce risk of damage to the generators as the lighter weight sensor housings are secured by simpler mounting means.

20 Claims, 4 Drawing Sheets

MONITORING THE OPERATING CONDITIONS OF ELECTRIC GENERATORS AND MOTORS BY PARTIAL MEASUREMENTS

TECHNICAL FIELD

This application relates generally to monitoring methods and instrumentation. More specifically, this application relates to methods and apparatus for monitoring electrical generators and motors by partial measurement of their operating conditions.

BRIEF DESCRIPTION OF THE DRAWINGS

The drawings, when considered in connection with the following description, are presented for the purpose of facilitating an understanding of the subject matter sought to be protected.

DETAILED DESCRIPTION

While the present disclosure is described with reference to several illustrative embodiments, it should be clear that the present disclosure should not be limited to such embodiments. Therefore, the description of the embodiments provided herein is illustrative of the present disclosure and should not limit the scope of the disclosure as claimed. In addition, while the following description references installation of sensors at the top and bottom of the rotor, it will be appreciated that the disclosure may include fewer or more sensor-mounts on different locations of the rotor, stator, or both.

Traditionally an array of sensors is placed over the surface of the rotor which is closely facing the bore surface of the stator. In this customary method the array of sensors covers the entire height or axial length of the rotor substantially parallel to the axis of rotation of the rotor.

When the rotor spins around its axis this full-length sensor array sweeps/passes over the bore surface of the stator and takes measurements of the entire inside surface area of the stator. Manufacturing of such long array of sensors, its installation, maintenance, repair, replacement, and its integrity in the face of high centrifugal forces and accelerations and decelerations are all very costly and time consuming.

Figure 1A:
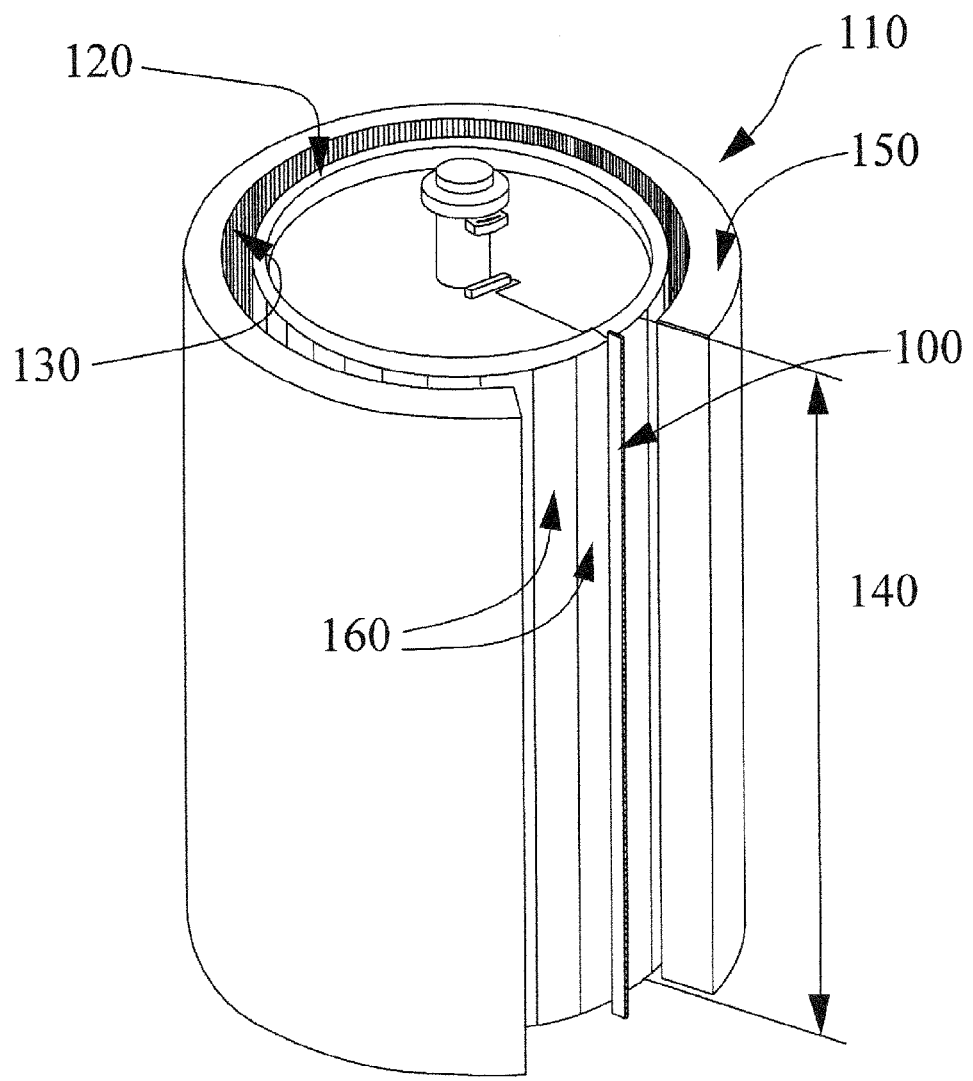
FIG. 1A shows a traditional full-length monitoring instrument mounted on an electric generator.

FIG. 1A shows a customary full-length monitoring instrument 100 installed on an electric/electrical generator 110. This customary Rotor-Mounted Scanner (RMS) 100 was developed as an online diagnostic and monitoring system for salient pole hydroelectric generators. The system consisted of the sensor array 100 mounted between two poles 160 of the rotor 120 to scan, at close range, the stator bore surface 130 for signs of operational stress and degradation. The sensor array 100 spanned the full axial height 140 of the poles 160, allowing scanning of the entire stator bore surface 130 as the poles 160 rotated around the inner circumference of the stator 150.

In this specification the axial height or axial length 140 of poles 160 or rotor 120 is substantially equal to the height of the cylindrical gap created between the outer region/surface of rotor 120 and the inner or the bore region/surface 130 of stator 150. The outer region or the outer surface of rotor 120 is defined as the region of rotor 120 that is facing the inner or the bore region/surface 130 of stator 150. It must be noted that the outer region of rotor 120 and the inner or the bore region of stator 150 also include any gap, cavity, or depression within the outer surface of rotor 120, such the gap between two poles 160 of the rotor 120, or the inner or the bore surface of stator 150.

Monitored parameters include thermal, RFI, magnetic, air gap spacing, acoustic, displacement, and vibration. The RMS sensing system included the primary sensor array 100, an on-rotor power supply (tapping field power), bidirectional infrared telemetry (for full-duplex command and data communications on and off the rotor), a data acquisition computer, and one or more displays.

The RMS system began development in 1985 by STI Optronics in Bellevue, Wash., and funded by EPRI and member power utility companies. The first prototype system was installed in 1987 on a 160MVA Hydro-generator in Washington State. Development continued through several alpha and beta prototypes until in 1991 when commercial operation began through a new entity formed under the name MCM Enterprise Limited. The system was offered for sale under the trademark HydroScan targeting both new and existing Hydro-generators. Over the next several years HydroScan systems were sold in North and South America, Europe, and Africa. A total of 56 units had been installed by the year 2000 although it had been projected that sales worldwide might exceed 1,600 units over a 20 year period on hydro and pump storage generators of 20 MW or greater based on metrics considering unit size, age of insulation system, operational duty cycles, etc., plus the cost benefits of condition monitoring. In 2000, the detachment of a sensor array mounted on a pump storage generator in North America put MCM Enterprise Ltd in distress ultimately contributing to bankruptcy proceedings for the company. Through liquidation, the assets of MCM were purchased by another company in the USA with the intent of continuing manufacturing and sales of HydroScan; however after two years the effort was discontinued. No more HydroScan systems were built after 2000, although existing customers have been supported since 2002 by Scanning Solutions, LLC of Redmond, Wash.

Over the years the Rotor-Mounted Scanner proved to be capable of detecting various failure mechanisms in Hydro-generators. The Rotor-Mounted Scanner system used a variety of sensor types in detecting failure mechanisms including:

1. Infrared thermal sensors: sensitive to infrared radiation and able to resolve stator bore surface temperatures with sufficient resolution and bandwidth to pinpoint abnormal conditions to individual stator winding elements (coils or bars). These thermal sensors reveal overheated stator coils/bars, restricted core ventilation ducts, interlaminate core shorts, and miscellaneous fringe-flux heated components in the end turn region such as core pressure fingers.
2. RFI sensors: sensitive to the emission of radio frequency magnetic and electric fields emitted from malfunctioning stator coils under voltage stress. These sensors detect end winding corona, partial discharge, slot discharge, and broken strand arcing. Both inductive and capacitive type RF detectors were used to pinpoint these conditions to individual coils/bars.

3. Magnetic field: Hall-Effect sensors, sensitive to magnetic fields from DC to 20 kHz, resolve orthogonal magnetic fields from armature (coil) currents and armature reaction. Sensors are mounted in all three dimensions and reveal current imbalances in coils/bars due to various abnormal conditions.
4. Air Gap sensors: sensitive to the proximity of magnetic permeable material, the response of these sensors provides a measurement of the distance between the inner surface of the stator with respect a fixed location on the rotor, with azimuthal resolution better than one stator slot width. Since the stator core is relatively flexible with respect to the rotor and unbalanced dynamic forces can potentially lead to damaging gap closures, measurements referenced from the rotor (as opposed to the stator measured to the rotor) are the preferred.
5. Accelerometers: piezoelectric devices that measure acceleration referenced to the mounting surface. Mounted inside each RMS Sensor Array to insure the mechanical integrity of the structure. Also used externally on rotor components such as poles and spider arms to measure vibration and resonance from dynamic forces within a generator.
6. Displacement sensors: proximity or capacitive type displacement sensors measuring movement of rotor structures such as the rim assembly or spider arms under static and dynamic loading conditions.

Applicant has empirically determined over 26 years that partial monitoring of a rotor or a stator, for example merely monitoring both (axial) ends of an electromotive stator armature assembly, is sufficient for detecting the majority of adverse conditions that may lead to eventual failure. In the following examples the axial "ends" of the stator armature assembly is defined as approximately the outer axial 1.5 feet of stator plus the 1 foot of stator winding exiting the core. As observed and tested by the applicant, this is the critical region of the stationary portion of an electromotive device where most failures occur. Physical movement of components in this region is more prevalent than in the axial interior of the device. Fringing magnetic forces and inconsistent cooling (varied thermal gradients) can result in higher stresses (mechanical and electromagnetic forces, and temperature gradients) and, along with lightly-supported stator winding components exiting the core in this region, more problems can occur with components in this area than with components in the middle regions of the stator armature. In addition, the applicant has observed that the vast majority of problems originating in the middle regions create symptoms detectable in the outer regions of the stator.

Figure 1B:
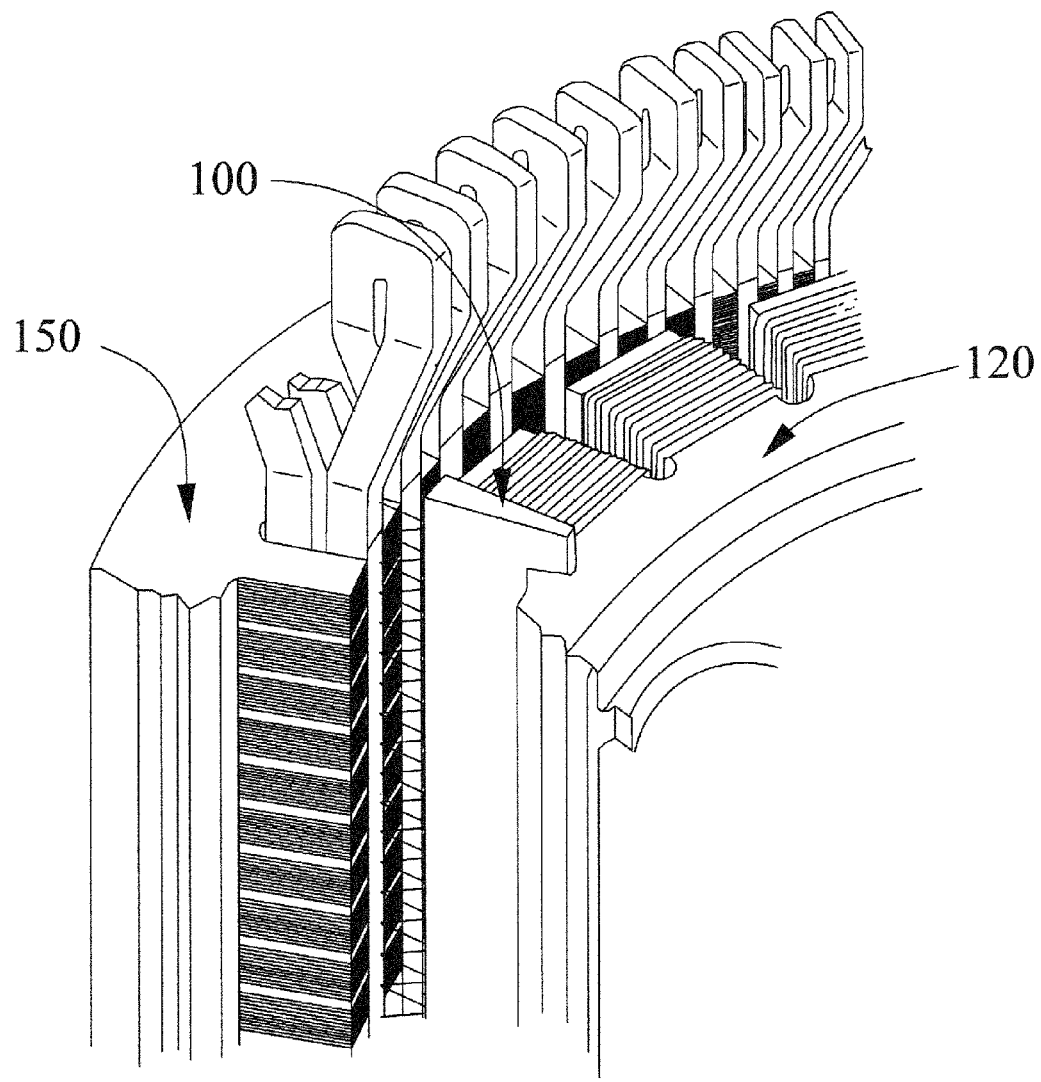
FIG. 1B shows more details of the traditional full-length monitoring instrument of FIG. 1A.

FIG. 1B shows more details of the traditional full-length monitoring instrumentation of FIG. 1A. FIG. 1B displays the typical mounting location of the RMS Sensor Array 100 containing the majority of the sensor types, oriented to view the stator 150 core and coil end-windings. As shown in FIG. 1B, the Sensor Array 100 stretches throughout the height of rotor 120.

The RMS system was developed under the premise that 100% sensor coverage of the stator bore was required in all installations. Hydro-generators and their associated turbines are custom devices as a rule, whereby designs are based on criteria at the actual installation site including, reservoir elevation of the impoundment (head), water flow availability, construction restrictions, power system and operational requirements, and a host of other environmental restrictions. These results in a generator constructed with physical geometries, electrical properties, cooling design, and rotational speed tailored to the site conditions; rotor geometries and rotational speed being the most critical parameters. Designing around these custom requirements ultimately led the RMS system to fail as a commercial product. This was primarily due to three reasons: (1) the systems were costly to produce; (2) systems were too complex and contained many individual components and required significant time, effort, and expertise to install; and (3) there was potential risk in the mechanical integrity of components mounted on the outside surface of the rotor.

One of the most important disadvantages of the traditional system is that the information acquired by the traditional sensors and sensor arrays is only useful for discovering problems or potential problems within the sensors' viewing window; in other words, limited to problems or potential problems of those parts that are immediately facing the sensors. Utilizing the disclosed methods in this disclosure, the state of failure mechanisms of the entire rotor and/or stator may be inferred, concluded, and extrapolated from the observed state of failure mechanisms of the rotor and/or stator within the viewing window of the sensors.

Since Hydro-generators vary significantly in their design, RMS systems required adaptation to meet these variations. Although most of the electrical components in the system were modular, the enclosures and/or mounting locations frequently varied. For instance, the Sensor Array contained many individual modules with IR thermal sensors, each covering five inches of vertical stator bore in their viewing window. With variation between the heights of different generators, the number of these modules within Sensor Arrays ranged from 9 to 28 between different designs. Sensors measuring rotor-to-stator air gap, acoustic emissions, vibration, and magnetic fields were also included on selected sensing modules within the Sensor Array. Early versions included RFI detectors as well. All sensors were specifically located in each new design to align with its intended target on the stator.

Bidirectional infrared telemetry became the preferred method of data communication to and from the rotor because any momentary loss of data could not be tolerated. Raw data was all processed off-rotor. RF telemetry was tested in various configurations but periodic data dropouts could not be eliminated and therefore this method was rejected. Infrared telemetry, on the other hand, was very reliable but required precise alignment between rotating and stationary telemetry components. As geometries and possible mounting locations for telemetry modules varied between different generators, the number of rotating telemetry modules necessary varied accordingly; single stationary telemetry modules required customization based on the number of these rotor modules used and the final radius of the mounting location. The total number of telemetry modules ranged between 9 and 15 on different installations. Custom cable assembles were also required.

Due to the significant amount of electrical components mounted on the rotor in a given RMS system, a robust power supply was required to support these components. A power supply sufficient to support the maximum amount of electrical components possible was designed, using power sourced from rotor excitation. This specialized switch-mode design included significant input filtering and functional complexity to support the system. It was expensive to manufacture and weighed 160 lbs including its enclosure and supporting bracket.

The different module configurations, custom enclosures and mounting supports, and custom interconnecting cable assemblies increased the amount of design required for each new generator. These factors ultimately increased the material and labor costs of producing the traditional RMS measurement system beyond reasonable bounds.

The total number of actual sensors included within an individual RMS was as high as 149. Components requiring individual mounting on the rotor or stator had exceeded 50 as well. Since special care was required to prevent mounted components from becoming loose over time and causing damage to the generator, the installation time and supervision effort became substantial. Installation durations averaged about two weeks; however in cases where the rotor is not removed from the stator and access was difficult, this installation time extended as high as four weeks.

Each new generator required a custom mechanical design for the Sensor Array. In many cases, the structure could only be supported at the ends although sometimes through existing cooling slots or dovetail joints in the rotor rim. Traditional designs often required different supporting methods and materials depending upon rotor speed and physical mounting restrictions, necessitating complex mechanical analysis. The customized nature of RMS increases the probability of oversight or error in the design process. In 2000, when a Sensor Array installed on a pump storage generator in the US detached from the rotor it caused significant damage to the stator.

The present application discloses methods and apparatus by which measurement of operating conditions of some parts of the rotor or stator will suffice prediction of potential problems in the entire rotor or stator, and does not necessitate full-length monitoring of the entire bore surface of the stator or the entire outer surface/region of the rotor. This will significantly reduce the number of sensors for monitoring the operating conditions of an electric generator.

Table 1, resulting from Applicant's empirical observations from the customary RMS program, details failure mechanisms that can occur within a Hydro-generator due to electromagnetic, thermal, and voltage potential forces, and identifies those problems that are detectable by less than full-monitoring of rotors or stators. With the presently disclosed method, for example, measurement of operating conditions at the core ends of the stator can result in the identification of 90% of the potential problems. As can be seen from Table 1, of the 20 potential problems listed, which relate directly to the stator, 90% are detectable from the core ends. The problems that may not be detected (Blocked Ventilation Ducts, Shorted Core Laminations) may result in localized heating of the core, which will not result in a failure prior to triggering a second failure mechanism that is detectable by partial measurements.

| | Potentially Problematic Operating Conditions | |
|---|---|---|
| | Potentially Problematic Operating Conditions | Detectable by Partial Measurements |
| 1 | Bad Ring Bus/Coil Joint | yes |
| 2 | Bad Coil/Knuckle Joint | yes |
| 3 | Loose Coil | yes |
| 4 | Loose End Bracing | yes |
| 5 | Broken Coil Strand(s) | yes |
| 6 | Shorted Coil Strand(s) | yes |
| 7 | Shorted Coil Turn(s) | yes |
| 8 | Expelled Coil | yes |
| 9 | Damaged Coil Ground Wall | yes |
| 10 | Damaged Coil Grading Paint | yes |
| 11 | Delaminated Coil Insulation | yes |
| 12 | Shorted Core Laminations | only if located at ends |
| 13 | Loose Core Laminations | yes |

-continued

| | Potentially Problematic Operating Conditions | |
|---|---|---|
| | Potentially Problematic Operating Conditions | Detectable by Partial Measurements |
| 14 | Deformed/Poorly Supported Core | yes |
| 15 | Loose Clamping Fingers | yes |
| 16 | Blocked Ventilation Ducts | only if located at ends |
| 17 | Trapped Air in Cooler | yes |
| 18 | Blocked Air Cooler | yes |
| 19 | Misaligned Rotor | yes |
| | Dynamic Flexing of Rotor Rim | N/A |
| | Shifting Rotor Hub Sections | N/A |
| | Loose Rotor Pole | N/A |
| | Loose Rotor Hub Section | N/A |
| 20 | Loose RMS Sensor Array | Yes |

In accordance with the disclosed new methods, the following improvements may also be made to the traditional methods of monitoring the operating conditions of electric generators:

1—Design a generic "Sensing Module" to be easily mounted, for example, the 2.5-feet of the top and the 2.5-feet of the bottom of the majority of Hydro-generators with minor mounting modifications; designed to operate in worst-case environmental conditions including high centrifugal forces.

2—As a result of easy mounting, easy maintenance, and more dependable sensing systems, incorporate recent advancements in electronic, instrumentation, and sensor technologies to:

a. Miniaturize the electronics on the rotor, thereby significantly reduce the size and weight of modules mounted on the rotor;

b. Incorporate proven off-the-shelf Air Gap monitoring and RF detecting systems;

c. Significantly reduce the power requirement of sensing electronics which reduces the overall on-rotor power supply requirements;

d. Replace expensive and complex infrared telemetry system with an off-the-shelf wireless system;

e. Develop a significantly smaller rotor-mounted power supply based on the lower power requirement of rotor electronics;

f. Utilize off-the-shelf data acquisition products for data processing and analysis;

g. Use off-the-shelf high voltage electrical components and develop a scaled down version of the RMS rotor power supply, wherein the new system power requirements will be roughly one-tenth of the RMS power supply, but still draw power from the rotor field, regardless of AC or DC excitation.

Figure 2A:
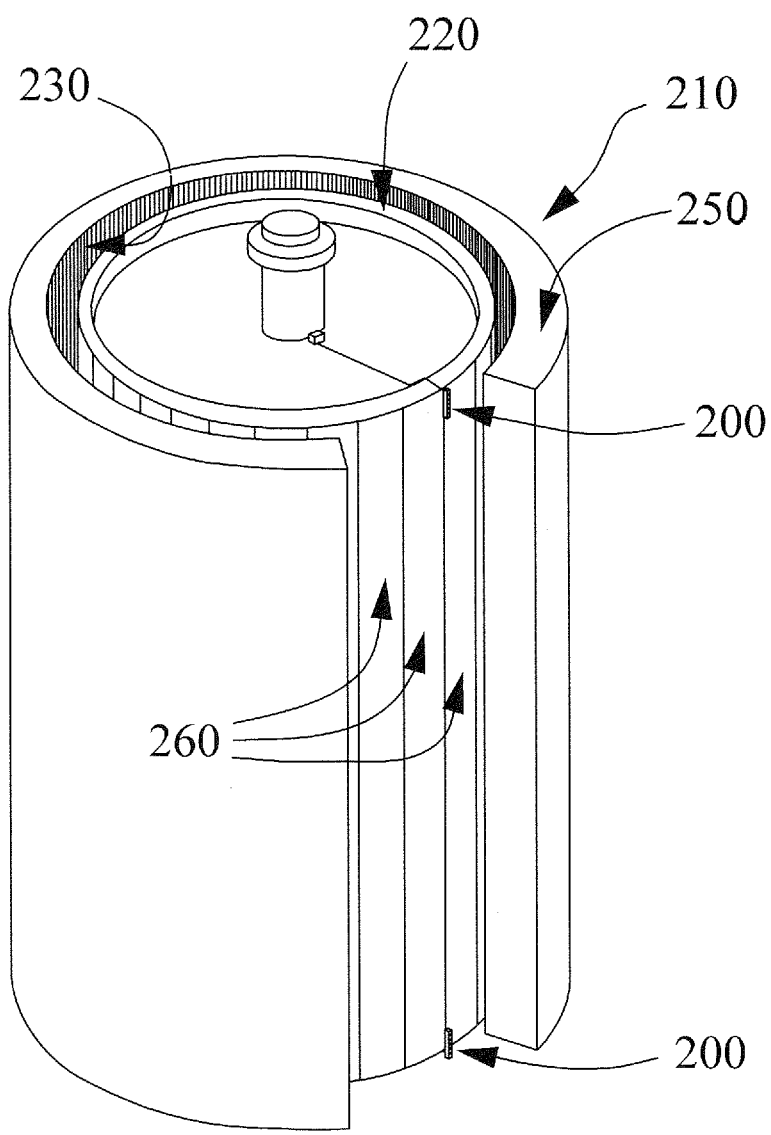
FIG. 2A shows an example of a partial-length monitoring instrument mounted on an electric generator, according to the present disclosure.

FIG. 2A shows an example of a partial-length monitoring instrument 200, also referred to as Sensor Array 200, mounted on an electric generator 210, according to the present disclosure. The Sensor Array 200 in this example is mounted between the top ends and the bottom ends of the two poles 260 of rotor 220. While the monitoring instrument 200 is able to only scan the top portion and the bottom portion of the bore surface 230 of stator 250, the scanned partial areas of bore surface 230 will provide enough information to detect 90% of the operating conditions of the entire bore surface 230.

Figure 2B:
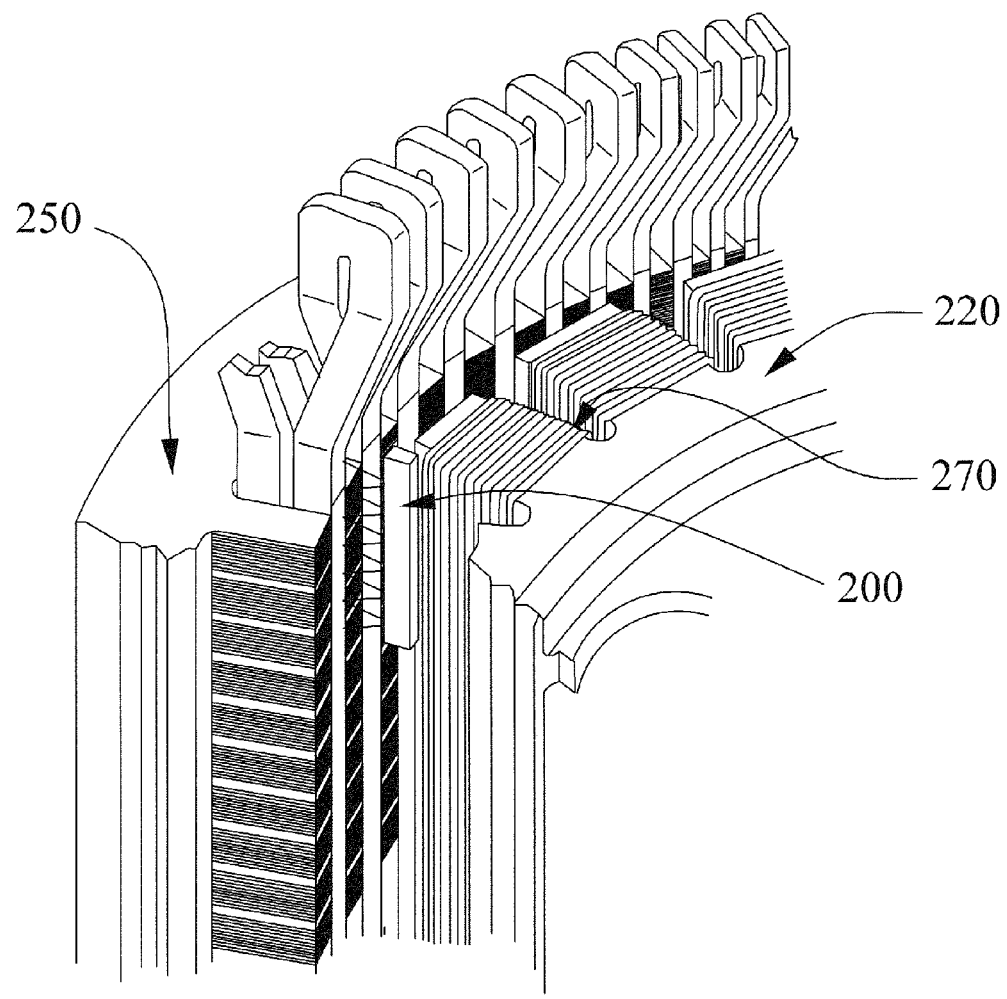
FIG. 2B shows more details of the partial-length monitoring instrument of FIG. 2A, according to the present disclosure.

FIG. 2B shows more details of the partial-length Sensor Array 200 of FIG. 2A, according to the present disclosure. FIG. 2B displays the mounting location of the example Sensor Array 200, which contains desired sensors and is oriented such that the sensors can view stator 250 core and coil end-windings. As shown in FIG. 2B, the Sensor Array 200 stretches only partially through the axial length of rotor 220.

In an embodiment of the present disclosure, the Sensor Array 200 may be a lightweight Sensor Module supported by a bracket attached to a structure behind the rotor poles 260 (rim plate or fan ring assembly) and extended into the inner-polar cavity 270. This "generic" Sensor Module and supporting bracket may be designed to fit most generator profiles with only minor modifications; and designed for worst-case centrifugal force limits, such as 500G's. Such a generic Sensor Module eliminates the need for performing complicated mechanical analysis for each new installation thereby reducing cost and the risk.

In various embodiments the Sensor Module described above may be replaced with infrared temperature sensors in an enclosure mounted on the surface of the rotor rim, between the rotor poles 260. Infrared sensors mounted in these enclosures may view the stator bore surface 230 through highly polished stainless steel tubing, varying in length for example from 6" to 18", and extending to within a few inches of the bore surface 230. The low emissivity of the inner tubing surface does not corrupt the IR radiation sensed by the sensor, although the signal is significantly smaller in radiant energy than if the sensor is close to the bore surface 230. A benefit of this method is the actual sensor is further removed from the area where strong armature AC magnetic fields are present, which can cause electrical noise in high gain circuits; therefore, higher amplifier gains may be used successfully to increase signal levels.

The stainless steel tubes may be secured to withstand centrifugal forces up to 1000G's and stiff enough to resist transverse movement during transient rotor conditions (starts and stops). Several of these tubes may be employed at different angles along the same vertical plane and lengths to achieve approximately the same coverage of the stator ends as was achieved by the previously discussed embodiment. Hall Effect magnetic field sensors and an RF detector may still be employed as these devices have small footprints. An inductive type air gap sensor with small sense coils may also be incorporated. Current cost of these embodiments is not significantly higher.

In yet other embodiments, the Sensor Module described above may be replaced with a significantly smaller and lighter mounting device supporting Polycrystalline infrared fibers (PIR), positioned approximately two inches from, and viewing the stator bore surface 230. The fiber or fiber bundle will extend to an enclosure mounted at or behind the rotor rim in a secure area and will couple to an infrared detector Like previous embodiments, since the footprints are small, Hall Effect magnetic field sensors and an RF detector may still be employed as well as an inductive air gap sensor.

In some embodiments a sensor may be mounted in a small enclosure secured in an axial air flow chamber of the rotor 220 with a coupled fiber extending radially outward through a cooling air slot. The fiber may be held within a secured fiberglass tube extending from the enclosure to the outside surface of the rotor 220. Although more expensive, this is a feasible method of implementing IR thermal sensing in high speed turbine generators and motors (1800-3600 RPM) where centrifugal forces are roughly an order of magnitude higher.

In some embodiments Hollow Silica Waveguide (HSW) is used in place of Polycrystalline IR fiber. HSW is approximately half the cost of the same diameter PR fiber and does not have any refractive losses since the end is open; however, it has losses due to bending and has some environmental limitations.

In various embodiments different sensors, Sensor Modules, and Sensor Arrays 200 may be installed on different parts of the axial height of the surface of rotor 220 or of stator 250. For example, an Infrared thermal sensor may be mounted within one foot of an axial end of a 20-foot high rotor 220 or stator 250; an RFI sensor may be mounted 10 feet from the axial end of rotor 220 or stator 250; and an Air Gap sensor and an Accelerometer may be mounted 5 feet from the other axial end of the 20-foot high rotor 220 or stator 250. In these embodiments no other sensors may be mounted over the remaining axial height of rotor 220 or stator 250.

In yet another embodiment, a rail or a track may be installed over the entire or part of the axial height of the outer surface of rotor 220 or of the bore surface 230 of stator 250, along which different sensors may travel and may be manually or remotely controlled. For example, a rail may be installed between two poles 260 of rotor 220, over which the Displacement sensor can controllably travel and monitor the stator bore surface 230 at any location throughout the height/length of rotor 220. In various embodiments several rails/tracks may be mounted between several poles 260 of rotor 220 or around the inner surface 230 of stator 250, and over each rail/track one or more sensors may be moveably mounted. In these embodiments the sensors may be brought to the ends of the rails for easy maintenance or replacement.

Those skilled in the art will realize that moving of the sensors along the rails and the tracks and the transfer of the information from the sensors to any recipient may be done in multiple ways and by multiple means, all of which are known in the art. For example moving of the sensors along the rails and the tracks may be done manually or mechanically, or the transfer of the information from the sensors to any recipient may be done wirelessly in real-time or during specific time intervals, etc.

Changes can be made to the claimed invention in light of the above Detailed Description. While the above description details certain embodiments of the invention and describes the best mode contemplated, no matter how detailed the above appears in text, the claimed invention can be practiced in many ways. Details of the system may vary considerably in its implementation details, while still being encompassed by the claimed invention disclosed herein.

Particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the claimed invention to the specific embodiments disclosed in the specification, unless the above Detailed Description section explicitly defines such terms. Accordingly, the actual scope of the claimed invention encompasses not only the disclosed embodiments, but also all equivalent ways of practicing or implementing the claimed invention.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes"

should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

The above specification, examples, and data provide a complete description of the manufacture and use of the composition of the invention. Since many embodiments of the invention can be made without departing from the spirit and scope of the invention, the invention resides in the claims hereinafter appended. It is further understood that this disclosure is not limited to the disclosed embodiments, but is intended to cover various arrangements included within the spirit and scope of the broadest interpretation so as to encompass all such modifications and equivalent arrangements.

While the present disclosure has been described in connection with what is considered the most practical and preferred embodiment, it is understood that this disclosure is not limited to the disclosed embodiments, but is intended to cover various arrangements included within the spirit and scope of the broadest interpretation so as to encompass all such modifications and equivalent arrangements.

What is claimed is:

1. A method of monitoring failure mechanisms of a rotor's outer region or a stator's inner region, in an electric generator or motor, by measuring operating conditions of a part of the outer region of the rotor or a part of the inner region of the stator, the method comprising:
    installing an array of desired sensors in the outer region of the rotor or in the inner region of the stator, wherein the array of sensors partially spans an axial length of the rotor or partially spans an axial length of the stator;
    measuring, within viewing windows of the sensors, operating conditions of the inner region of the stator or the outer region of the rotor, respectively;
    monitoring failure mechanisms of the stator's inner region or the rotor's outer region from the measurements taken within viewing windows of the sensors; and
    concluding state of failure mechanisms of the stator's inner region or the rotor's outer region outside viewing windows of the sensors from state of monitored failure mechanisms within viewing windows of the sensors.

2. The method of claim 1, wherein the array of sensors is installed substantially parallel to an axis of rotation of the rotor.

3. The method of claim 1, wherein the failure mechanisms of the rotor's outer region or the stator's inner region are all, or a subset of, localized temperature, RF emissions, magnetic field disturbance, displacement of components, and vibration.

4. The method of claim 1, wherein the array of sensors is installed at one or both ends of the axial length of the rotor or the axial length of the stator.

5. The method of claim 1, wherein multiple arrays of sensors are installed in a single row that is substantially parallel to the axis of rotation of the rotor; in multiple rows that are substantially parallel to the axis of rotation of the rotor; or a combination thereof.

6. The method of claim 1, wherein the array of sensors includes a single sensor or multiple sensors.

7. The method of claim 1, wherein the array of sensors includes and controllably moves on a track that is substantially parallel to the axis of rotation of the rotor.

8. The method of claim 7, wherein the movement of the array of sensors on the track is remotely controllable.

9. An apparatus for monitoring desired failure mechanisms of a rotor's outer region or a stator's inner region, in an electric generator or motor, the apparatus comprising;
    an array of selected sensors configured to be installed in the outer region of the rotor or the inner region of the stator-such that the array of sensors only partially spans an axial length of the rotor or only partially spans an axial length of the stator and only measures the operating conditions of a part of the inner region of the stator or the outer region of the rotor that lies substantially within a viewing window of the sensors, and wherein state of failure mechanisms of the stator's inner region or the rotor's outer region outside viewing windows of the sensors is concluded from state of monitored failure mechanisms of the stator's inner region or the rotor's outer region within viewing windows of the sensors.

10. The apparatus of claim 9, wherein the array of sensors is installed substantially parallel to an axis of rotation of the rotor.

11. The apparatus of claim 9, wherein the desired failure mechanisms of the rotor's outer region or the stator's inner region are all or a subset of localized temperature, RF emissions, magnetic field disturbance, displacement of components, and vibration.

12. The apparatus of claim 9, wherein the array of sensors is installed at one or both ends of the axial length of the rotor or the axial length of the stator.

13. The apparatus of claim 9, wherein multiple arrays of sensors are installed in a single row that is substantially parallel to the axis of rotation of the rotor; in multiple rows that are substantially parallel to the axis of rotation of the rotor; or a combination thereof.

14. The apparatus of claim 9, wherein the array of sensors includes a single sensor or multiple sensors.

15. The apparatus of claim 9, wherein the array of sensors includes and controllably moves on a track that is substantially parallel to the axis of rotation of the rotor.

16. The apparatus of claim 15, wherein the movement of the array of sensors on the track is remotely controllable.

17. An electrical system comprising:
a stator;
a rotor, wherein the rotor rotates inside the stator and generates work or electricity or wherein the stator spins around the rotor and generates work or electricity;
a sensor installed in an outer region of the rotor or an inner region of the stator substantially close to an end of an axial length of the rotor or close to an end of an axial length of the stator, respectively, wherein the sensor only partially spans an axial length of the rotor or only partially spans an axial length of the stator; and
wherein the sensor measures the operating conditions of the axial end area of the inner region of the stator or the axial end area of the outer region of the rotor, respectively, and wherein partial measurements of the axial end area of the inner region of the stator or the axial end area of the outer region of the rotor is utilized to infer and monitor failure mechanisms in other areas of the stator's inner region or the rotor's outer region.

18. The system of claim 17, wherein the sensor is an array of multiple sensors.

19. The system of claim 18, wherein the array of sensors includes and controllably moves on a track that is substantially parallel to an axis of rotation of the rotor.

20. The system of claim 17, wherein the failure mechanisms of the rotor's outer region or the stator's inner region are all or a subset of localized temperature, RF emissions, magnetic field disturbance, displacement of components, and vibration.

* * * * *